United States Patent [19]

Keys et al.

[11] Patent Number: 4,755,446

[45] Date of Patent: Jul. 5, 1988

[54] PHOTOSENSITIVE COMPOSITIONS CONTAINING MICROCAPSULES CONCENTRATED IN SURFACE LAYER

[75] Inventors: Dalen E. Keys; William J. Nebe, both of Wilmington, Del.; Thomas R. Fields, Kennett Square, Pa.

[73] Assignee: E. I. Du Pont de Nemours and Company, Wilmington, Del.

[21] Appl. No.: 6,420

[22] Filed: Jan. 12, 1987

[51] Int. Cl.[4] .......................... G03C 1/68; G03F 7/16
[52] U.S. Cl. ................................. 430/138; 430/270; 430/281; 430/202
[58] Field of Search ............... 430/138, 270, 281, 202

[56] References Cited

U.S. PATENT DOCUMENTS

| | | | |
|---|---|---|---|
| 3,219,446 | 11/1965 | Berman | 96/28 |
| 3,700,439 | 10/1972 | Phillips, Jr. | 96/27 R |
| 4,399,209 | 8/1983 | Sanders et al. | 430/138 |
| 4,438,189 | 3/1984 | Geissler et al. | 430/280 |
| 4,440,846 | 4/1984 | Sanders et al. | 430/138 |
| 4,501,809 | 2/1985 | Hiraishi et al. | 430/138 |
| 4,636,453 | 1/1987 | Keys et al. | 430/138 |
| 4,687,725 | 8/1987 | Wright et al. | 430/202 |

FOREIGN PATENT DOCUMENTS 2533684 3/1984 Australia .
2109331A 2/1985 United Kingdom .

*Primary Examiner*—John L. Goodrow

[57] ABSTRACT

Photosensitive compositions contain a surface layer of microcapsules which influence interfacial properties.

14 Claims, No Drawings

PHOTOSENSITIVE COMPOSITIONS CONTAINING MICROCAPSULES CONCENTRATED IN SURFACE LAYER

BACKGROUND OF THE INVENTION

The present invention is directed to photosensitive compositions containing rupturable microcapsules.

Photosensitive compositions particularly useful as photoresists are well known in the prior art. Conventionally these compositions are stored in roll form. The composition is adhered to a support film to form a two ply material such as disclosed in Flint, U.S. Pat. No. 4,293,635 or more conventionally in a three ply material such as Celeste. U.S. Pat. No. 3,469,982 with the composition sandwiched between a support film and a cover sheet. The material is unwound from a roll and the cover sheet, if present, is removed from contact with the photosensitive composition prior to use in lamination to a substrate, e.g., in manufacture of printed circuit boards.

The present invention also relates to incorporation of microcapsules in a photosensitive material. Microcapsules such as pressure rupturable microcapsules which have solvent resistant outer walls surrounding active components are known. Several procedures have been described for preparing various types of microcapsules, e.g., Wurster U.S. Pat. No. 2,648,609 (fluidized bed), Vandegaer U.S. Pat. No. 3,577,515 and Ruus U.S. Pat. No. 3,429,827 (interfacial polymerization), Macauley U.S. Pat. No. 3,016,308 (urea/formaldehyde condensation), Green U.S. Pat. No. Re. 24,899 (coacervation), Chao U.S. Pat. No. 4,495,509 (interchange off emulsions). Brynko U.S. Pat. No. 2,969,331 (dual-walled). There are a large number of patents which describe the preparation and use of microcapsules which rupture and release material enclosed by the microcapsule.

Photosensitive materials employing microencapsulated radiation sensitive compositions are the subject of U.S. Pat. Nos. 4,399,209 and 4,440,846 assigned to The Mead Corporation. Berman, U.S. Pat. No. 3,219,446 discloses a transfer imaging process in which a blue-black dye is encapsulated with a photocrosslinkable polymer or a photopolymerizable monomer in a film or a layer of discrete microcapsules. Phillips, U.S. Pat. No. 3,700,439, discloses a process wherein Michler's ketone is encapsulated in a conventional manner and provided as a layer on a support.

British Patent Publication No. 2,109,331A discloses that microcapsules resistant to solvent action can be prepared with either
(i) at least two prepolymers selected from a melamine/formaldehyde prepolymer, a thiourea/formaldehyde prepolymer and a melamine/thiourea/formaldehyde prepolymer or
(ii) a melamine/thiourea/formaldehyde prepolymer, which are suitable for selective release of color formers in an area where pressure is applied.

Australian Patent No. 25336/84 discloses that microcapsules can be prepared with reduced permeability by treatment of microcapsule walls with a reaction product of formaldehyde and a member from a group of disclosed hydroxylated organic aromatic compounds.

Geissler et al. U.S. Pat. No. 4,438,189 discloses radiation polymerizable mixtures with a concept on the paragraphs bridging columns 3 and 4 of incorporation of crosslinking compounds which are very reactive and soluble in a coating mixture with premature reaction prevented by encapsulating in a covering substance which is insoluble in the coating solvent and which melts or systems below the temperature of subsequent heating for post cure.

SUMMARY OF THE INVENTION

The present invention is directed to a storage stable photopolymerizable element wound in a roll comprising a supported photopolymerizable composition which contains all components needed for photopolymerization of said composition wherein the composition contains microcapsules on its surface or concentrated near its surface within the composition on a side of the photopolymerizable composition which faces away from the support or which faces toward the support whereby the microcapsules contain a material which is a liquid or a precursor to a liquid whereby said liquid or precursor has the ability to influence the interfacial properties of the photopolymerizable composition or a photopolymerized composition resulting from said photopolymerizable composition and another material and wherein the support comprises a strippable flexible film.

The present invention is also directed to application of the supported photopolymerizable composition to a substrate whereby the microcapsules influence the interfacial properties of the photopolymerizable composition or the photopolymerized composition resulting therefrom and either a substrate or a material which is subsequently applied to the photopolymerizable or photopolymerized composition.

Also in the present invention a positive working photosensitive composition may be employed rather than a negative working photopolymerizable composition.

DETAILED DESCRIPTION OF THE INVENTION

In the present invention conventional photosensitive compositions can be employed with the added component of microcapsules which supply an added component which modify the interfacial properties of the composition or the photopolymerized composition resulting therefrom. The microcapsules are concentrated at or adjacent a surface of the photosensitive composition (which is not present as a liquid) since they enhance a surface property as opposed to modification of the entire matrix of the photosensitive composition. Although in the discussion below reference is made to photopolymerizable compositions, it is understood that the present invention is applicable to both positive working and negative working photosensitive compositions. Also it is understood that in the present invention the purpose of the microcapsules is to influence and change interfacial properties of the photopolymerizable or photopolymerized composition. Nevertheless diffusion of the contents of microcapsules into and through the matrix of such composition can take place even though the primary purpose of the microcapsules is to allow a high concentration of a liquid to influence the interfacial boundary between the photopolymerizable or photopolymerized composition and another material, i.e., a substrate or a material applied to the composition.

The term "microcapsule" as used throughout the specification means hardened polymer walls or shells containing one or more ingredients which influence the properties of the photopolymerizable or photopolymerized composition at its surface. Although in one preferred mode of the present invention the capsules are pressure rupturable, it is understood that other techniques of breaking the walls of the microcapsules can be employed, e.g., by use of heat. It is also understood that the inner contents of the microcapsule need not be a liquid but can contain a precursor to a liquid, e.g., a solid material which liquifies under lamination conditions. The microcapsules must have outer walls of sufficient strength to contain a component which influences the photopolymerizable or polymerized layer but which can be handled and coated without adverse effects. If pressure application is employed to break the contents of the capsule the walls must fracture under such pressure (e.g., with pressure exerted downward, under a blunt hard surface with smooth rounded edges, e.g., hard surface with dimensions of about 0.5 cm×2.0 cm) or the walls must fracture by application of heat.

"Microencapsulation" as used throughout the specification means a process by which one or more ingredients become encased in a hardened polymer. The discrete walled microcapsules used in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,730,456 and 2,800,457 to Green et al) including gum arabic, polyvinyl alcohol, carboxy-methyl-cellulose; resorcinol-formaldehyde wall-formers (see U.S. Pat. No. 3,755,190 to Hart et al); isocyanate wall-formers (see U.S. Pat. No. 3,914,511 to Vassiliades); isocyanate-polyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); melamine-formaldehyde resin and hydroxypropyl cellulose (see U.S. Pat. No. 4,025,455 to Shackle); and emulsion interchange (See U.S. Pat. No. 4,495,509 to Chao). A preferred wall material is urea/resorcinol/formaldehyde.

The internal phase of the microcapsules can be a water-immiscible oil which influences the surface properties of the photopolymerized or photopolymerizable composition. Discussion of such component is set forth in the section dealing with utility of the photopolymerizable element.

The size of the microcapsules ranges from 0.1 to 25 μm, preferably 1.0 to 10 μm although larger particles are likewise suitable. Conventional microscopic examination, scanning electron microscopy, and particle size measurement techniques such as the Coulter ® Counter can be used to determine the sizes of the microcapsules and also measure size distribution. About 5 to 40% of the total microcapsule weight normally constitutes wall material. The shape of the microcapsules is preferably in uniform spheres although other forms can be used provided that they are sufficiently rupturable.

The microcapsules employed in the present invention are not dispersed throughout the matrix of photopolymerizable composition but are present either as a coating on one surface of the photopolymerizable film or are formulated within the photopolymerizable composition so that the microcapsules are present predominantly adjacent one surface portion. The microcapsules can be adhered to the surface of the composition such as with a binder or can be laminated onto the surface of the photopolymerizable materials. Generally less preferred is to formulate the microcapsules within the matrix of the photopolymerizable composition with the capsules contiguous to one surface. Since the photopolymerizable composition is present as a film on a support, the microcapsules either face away or toward the support, or both when both sides of the photopolymerizable compositions utilize microcapsules. In the latter case the capsules will ordinarily differ in composition from one surface to the other to optimize the properties which can be imparted although in specific instances the same microcapsules would be employed.

An important use of microcapsules on or adjacent to the surface of the photopolymerizable film which faces away from the support is in lamination of the photopolymerizable film to a substrate. During the lamination process the pressure of lamination can be employed to rupture the microcapsules to release the encapsulated constituent. Various publications disclose techniques which involve a wet lamination technique wherein a layer of liquid is present between a substrate of a photoresist film. Illustratively U.S. Pat. No. 4,293,635 discloses use of an intermediate ethanol water solution, U.S. Pat. No. 3,629,036 discloses application of a liquid adhering agent, preferably a solvent for a resist containing a small amount of dissolved resist, to a surface of a substrate followed by application of a photosensitive resist film, and U.S. Pat. No. 4,069,076 discloses a process for applying a photoresist film to a preimaged pattern relief substrate after flooding the substrate with a solvent or a nonsolvent swelling agent. Also in the prior art it is known in lamination of a photosensitive solder mask film onto a substrate having a raised relief that an intermediate liquid layer aids to remove air which would otherwise be entrapped between the substrate and the film.

In such instance the microcapsules allow dry lamination with the microcapsules providing the desired liquid component. Examples of materials which can add in lamination of the photosensitive composition to a substrates are the same liquids described in the above patents.

It is likewise within the scope of the present invention to introduce capsules which are not for the purpose of influencing interfacial characteristics but impart beneficial properties because such capsules are present in a layer rather than throughout the photopolymerizable composition. An example of such component is a dye present on a surface furthest away for passage of actinic radiation. The dye does not interfere with passage of actinic radiation compared to a dye present throughout the composition. In a variation of the technique the added component, e.g., the dye, could form a portion of the capsule wall and not be a component within the microcapsules.

In the previous discussion advantages are discussed if the microcapsules rupture during lamination. However it is not necessary that these capsules are designed to be pressure rupturable. Illustratively when the capsules contain a dye, use of heat or other means can be employed to cause breaking of the capsules. In the preceding discussion the microcapsules have been present in contact or adjacent the surface of the photopolymerizable composition which faces away from a support material. However important advantages flow with the microcapsules facing toward the support. The capsules can be ruptured during lamination in the same manner as the prior discussion or subsequent to such lamination procedure. The important use of microcapsules at the interface of the support film and photopolymerizable composition is to influence the composition either before or after exposure to actinic radiation with the support film no longer in place.

An important use of microcapsules is when the composition is employed as a solder mask. The microcapsules can contain a flux useful for soldering or a component which would prevent solder wetting. Examples of components within the microcapsules include surface active agents, fluxes, oils, glycols, and high boiling solvent.

As previously described the constituents of the photopolymerizable compositions are well known and will conventionally include ethylenically unsaturated compound, photoinitiator and polymeric organic binder. These compositions can contain useful additives which likewise are well known such as inhibitors, dyes such as leuco dyes, photoinhibitors, accelerators such as chain transfer agents, oxygen scavengers, plasticizers, dyes and pigments to increase visibility of the image. sensitizers, fillers, etc.

The ethylenically unsaturated compounds (photopolymerizable monomers) generally have a boiling point above 100° C. at normal atmospheric pressure and are capable of forming a high molecular weight polymer by photoinitiated, addition polymerization. Suitable compounds are disclosed in Chang U.S. Pat. No. 3,756,827 and in Chambers U.S. Pat. No. 4,245,031. Many of the polymerizable monomers are subject to thermal polymerization, especially when stored for long periods or at elevated temperatures. When such compounds are supplied commercially, it is customary for them to contain a small, but effective, amount of a thermal polymerization inhibitor. These inhibitors may be left in the monomers when the photopolymerizable coating compositions of this invention are prepared. The resulting compositions usually have satisfactory thermal stability. If unusual thermal exposure is anticipated, or if monomers containing little or no thermal polymerization inhibitor are employed, compositions with adequate shelf life can be obtained by incorporating, e.g., up to 0.5 percent, by weight of monomer, of a thermal polymerization inhibitor such as hydroquinone, methylhydroquinone, p-methoxyphenol, etc. Preferred ethylenically unsaturated compounds are polyethylene glycol diacrylate, tetraethylene glycol diacrylate and polyoxyethylated trimethylolpropane triacrylate, trimethylolpropane triacrylate, and trimethylolpropane trimethacrylate.

Useful photoinitiators compound types include; hexaarylbiimidazole compounds, 4-trichloromethyl-4-methyl-2,5-cyclohexadienones, quinones, alkylaryl ketones and benzophenones. The biimidazoles are photodissociable to the corresponding triarylimidazolyl radicals. Useful 2,4,5-triarylimidazolyl dimers are disclosed in Baum & Henry U.S. Pat. No. 3,652,275.

Useful quinone types are: camphorquinone, substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, 1,2,3,4-tetrahydronaphthacenequinone, and 1,2,3,4-tetra-hydronbenz(a)anthracene-7-, 12-dione.

Useful alkylaryl ketones include; vicinal ketaldonyl alcohols such as benzoin, pivaloin, acryloin ethers, e.g., benzoin methyl ether, benzoin ethyl ether, benzoinisopropyl ether, benzoin sec-butyl ether, benzoin isobutyl ether, benzoin n-butyl ether; α-hydrocarbon-substituted aromatic acryloins, including α-methylbenzoin, α-allylbenzoin and α-phenylbenzoin, benzoin dialkyl ketals such as benzil dimethylketal, benzil ethyleneglycol ketal, benzil, benzoin esters such as O-acetyl benzoin and O-acylated oximinoketones such as 1-phenyl-1,2-propanedione-2-O-benzoyloxime.

Benzophenones useful as photoinitiators include: benzophenone, 4,4'-dichlorobenzophenone, fluorenone, anthrone, thioxanthone, xanthone, Michler's ketone, 4-dimethoxyaminobenzophenone, 4-morpholinobenzophenone.

4-Trichloromethyl-4-methyl-2,5-cyclohexadienone compounds useful in this invention are disclosed in Sysak U.S. Pat. No. 4,341,860, the disclosure of which is incorporated by reference.

Preferred initiators are benzoin methyl ether, Michler's ketone, and benzophenone.

Macromolecular organic polymeric binders are present in the photopolymerizable compositions which are generally thermoplastic. Polymeric binder types include: (a) copolyesters based on terephthalic, isophthalic, sebacic, adipic and hexahydroterephthalic acids: (b) nylons or polyamides; (c) vinylidene chloride copolymers; (d) ethylene/vinyl acetate copolymers; (e) cellulosic ethers; (f) polyethylene; (g) synthetic rubbers; (h) cellulose esters; (i) polyvinyl esters including polyvinyl acetate/acrylate and polyvinyl acetate/methacrylate copolymers; (j) polyacrylate and poly-α-alkyl-acrylate esters, e.g., polymethyl methacrylate and polyethyl methacrylate; (k) high molecular weight ethylene oxide polymers (polyethylene glycols) having weight average molecular weights from 4000 to 4,000,000; (l) polyvinyl chloride and copolymers; (m) polyvinyl acetal; (n) polyformaldehydes; (o) polyurethanes; (p) polycarbonates; (q) polystyrenes, (r) block copolymers, e.g., AB and ABA (styrene-isoprene-styrene) types.

In a particularly preferred embodiment of the invention, the polymeric binder is selected so that the unexposed photopolymerizable coating is soluble in predominantly aqueous solutions, for example dilute aqueous alkaline solutions, but upon exposure to actinic radiation becomes relatively insoluble therein. However, compositions formulated to be removed by solvents as is well known are likewise suitable.

Optionally dyes such as leuco dyes can also be present in the photopolymerizable compositions. By the term "leuco dye" is meant the colorless (i.e., the reduced) form of a dye compound which can be oxidized to its colored form by the triarylimidazolyl radical. Leuco dyes are disclosed in Baum & Henry U.S. Pat. No. 3,652,275.

Accelerators or reducing agents such as oxygen scavengers and active hydrogen donors acting as chain transfer agents are useful additions to compositions to improve photospeed. Useful oxygen scavengers are organophosphines, organophosphonates, organophosphites, stannous salts and other compounds that are easily oxidized by oxygen. Useful chain transfer agent are N-phenyl glycine. trimethylbarbituric acid, 2-mercaptobenzoxazole, 2-mercaptobenzothiazole, and other compounds that have hydrogens that are readily abstractable by radicals. A preferred oxygen scavenger is triphenylphosphine.

A wide range of nonpolymerizable plasticizers are effective in achieving improved exposure and development temperature latitude. When a macromolecular binder is present in the layer, plasticizer selection would be based on those well known in the art to be compatible with it as well as the monomer, dimer, ketone and other components. With acrylic binders, for example, dibutyl phthalate and other esters of aromatic acids; esters of aliphatic polyacids such as diisooctyl adipate, nitrate esters, etc.; aromatic or aliphatic acid esters of glycols, polyoxyalkylene glycols, aliphatic polyols, etc.; alkyl and aryl phosphates; low molecular weight polyester of poly-α-methylstyrenes; chlorinated paraffins; and sulfonamide types may be used. Other inert additives such as dyes, pigments and fillers are known to those skilled in the art. These additives are generally present in minor amounts and should not interfere with the exposure of the photopolymerizable layer.

Suitable sensitizers include those disclosed in Dueber U.S. Pat. No. 4,162,162, and Anderson U.S. Pat. No. 4,268,667 and 4,351,893.

The photopolymerizable compositions described herein may be applied to a wide variety of substrates dependent on the use of the final article such as applied by lamination to a metal sheet or foil, a sheet or film of synthetic organic resin, cellulose paper, fiberboard, and the like, or a composite of two or more of these materials. Specific substrates include alumina-blasted aluminum, anodized aluminum, alumina-blasted polyethylene terephthalate film, polyethylene terephthalate film, e.g., resin-subbed polyethylene terephthalate film, flame or electrostatic discharge treated polyethylene terephthalate film, polyvinyl alcohol-coated paper, crosslinked polyester-coated paper, nylon, glass, cellulose acetate film, heavy paper such as lithographic paper, and the like. A preferred substrate is a copper coating on an insulating material useful in the manufacture of printed circuit board; another preferred substrate is anodized aluminum used in the preparation of lithographic printing plates.

The layer of the photopolymerizable compositions can vary within wider limits, e.g., solder mask compositions conventionally are thicker than photoresist not used as solder masks. A preferred thickness is from about 0.0001 inch (~0.0003 cm) to about 0.01 inch (0.025 cm). The composition is adhered with low to moderate adherence to a thin, flexible, film support generally polymeric which may transmit radiation actinic to the photopolymerizable layer. The opposite side of the photopolymerizable layer may present a protective cover layer or cover sheet wherein the sheet has less adherence than the adherence between the film support and the layer although such layer is not always needed. A particularly preferred support is a transparent polyethylene terephthalate film having a thickness of about 0.001 inch (~0.0025 cm). Polyethylene, 0.001 inch (~0.0025 cm) is a preferred cover sheet; polyvinyl alcohol coating is a preferred cover layer. It is directly understood that in the present invention a cover sheet need not be employed with specific photopolymerizable compositions, e.g., the composition of Flint U.S. Pat. No. 4,273,635 does not require a cover sheet. Also the microcapsules could serve as a replacement for the cover sheet to allow the photopolymerizable composition to be wound in a roll and unwound when used, e.g., in lamination to a substrate.

The photopolymerizable composition on a support film (with or without a cover film) is wound in a roll due to convenience in storage. The element is storage stable and can be held at 40° C. for two weeks either before or after lamination without any substantial amount of crosslinking. Preferably, the composition is storage stable for four weeks. A substantial amount of crosslinking in storage would render the composition unsuitable for use.

In use of the photopolymerizable element as a photoresist, the element is unwound from a roll, the cover sheet is removed if present and the supported photopolymerizable composition is laminated to a substrate. Thereafter with or without the support in place, the photopolymerizable layer is imagewise exposed, i.e., through a photomask, to actinic radiation, the exposed areas of the photopolymerizable layer are removed and the substrate is permanently modified by etching or plating where it is not covered by the photopolymerizable layer. Thereafter the photopolymerizable layer of the resist is removed from the substrate. For solder mask use, the polymerized portions remain permanently in place without removal from the substrate.

In the preceding discussion reference has been made to use of microcapsules with a supported photopolymerizable film. However it is within the scope of the present invention that a supported positive working photosensitive film be employed rather than the negative working photopolymerizable composition. The preceding discussion is applicable to in the manner of incorporation of the microcapsules, the composition of the microcapsules in relation to the composition of the photosensitive material processing such as lamination. The key aspect remains that the microcapsules are present on or adjacent on surface of the photosensitive composition. Useful positive working compositions are disclosed in Cohen et al. U.S. Pat. No. 4,193,797. Such compositions are storage stable and can be stored, e.g., at room temperature for a time period such as six months.

In the following examples all parts are by weight and degrees are in centigrade unless otherwise specifically set forth.

EXAMPLE 1

Microcapsules were prepared by the following procedure. A solution of 4.07 g poly(ethylene-comaleic anhydride), Polysciences, in 301.9 g water was prepared by the addition of NaOH pellets and gently heating. This solution was placed in a Waring blender and 3.06 g of gum arabic was added and dissolved. The pH of the solution was adjusted to 3.0 by adding 1N HCl and then 6.00 g of urea and 0.75 g of resorcinol were added. The solution was then heated to 60° C. and 181.3 g of trimethylolpropane triacrylate were added to the aqueous solution and emulsified at a variable transformer setting of 70 for 5 seconds and then at a setting of 50 for 60 seconds. Then 15.20 g of formalin were added and the emulsion was stirred at 60° C. for 5 minutes. The reaction mixture was then poured into a beaker equipped with an overhead stirrer, pH electrode, and temperature regulation sensor. The reaction mixture was stirred in the beaker at about 450 rpm at 60° C. for 55 minutes at pH 3. Then 4.09 g of formalin were added and the slurry was stirred an additional hour at 60° C. at pH 3. A solution of 2.6 g ammonium sulfate in 40.3 g water was added and the reaction was continued at 60° C. for one hour, the pH was adjusted to 8 with 1N NaOH solution and 8.09 g of sodium bisulfite was added. Heating was continued for 15 minutes and then the slurry was cooled to room temperature. This process yielded capsules with a volume mean diameter of 6.0 microns.

To 10.9 of the capsule slurry was added 2 drops of Triton ® X-100 surfactant and 2 drops of Carboset ® 514H (methylmethacrylate/ethylacrylate/acrylic acid copolymer). After stirring, the resulting slurry was coated with a 2 mil doctor knife onto Riston ® I-Film 102T which contains a support layer and a photopolymerizable layer. The film was air dried at room temperature for several hours. The dry film was then dry laminated at 1.4 meters/minute onto a precleaned copper board using 40 psi air pressure with a Riston ® Hot Roll Laminator set at 105° C. After exposure to 200 mj/cm$^2$, the entire Riston ® film was removed from the copper board by peeling up the film base. Peeling up the film showed that a liquid was indeed present on the surface of the board indicating that capsules had ruptured with release of the capsules liquid contents. FTIR analysis of the liquid on the board showed it was the monomer that had been overcoated. Also, scanning electron microscopic analysis of the capsule overcoat layer showed ruptured capsules.

EXAMPLE 2

Microcapsules were prepared by the following method. An internal phase solution was prepared by dissolving 25.7 g pentaerythritol triacrylate, 10.12 g benzoin methyl ether, 6.04 g benzotriazole, 50.79 g Photomer ® 4149, in 175.0 g trimethylolpropane triacrylate.

Separately, a solution of 6.03 g poly(ethylen-co-maleic anhydride). Polysciences, in 300.2 g water by the addition of NaOH pellets and gently heating. This solution was placed in a Waring blender and 3.06 g of gum arabic was added and dissolved. The pH of the solution was adjusted to 3.0 by adding 1N HCl and then 12.55 g of urea and 1.21 g or resorcinol were added. The solution was then heated to 60° C. and 202.6 g of internal phase solution was added to the aqueous solution and emulsified at a variable transformer setting of 60 for 20 seconds and then at a setting of 50 for 15 seconds. Then 34.13 g of formalin were added and the emulsion was stirred at 60° C. for 5 minutes. The reaction mixture was then poured into a beaker equipped with an overhead stirrer, pH electrode, and temperature regulation sensor. The reaction mixture was stirred in the beaker at about 450 rpm at 60° C. for 55 minutes at pH 3. Then 5.20 g of formalin was added and the slurry was stirred an additional hour at 60° C. at pH 3. A solution of 2.6 g ammonium sulfate in 40.8 g water was added and the reaction was continued at 60° C. for one hour but the pH was allowed to decrease. At the end of this hour, the pH was adjusted to 8 with 1N NaOH solution and 8.10 g of sodium bisulfite was added. Heating was continued for 15 minutes and then the slurry was cooled to room temperature. This process yielded capsules with a volume mean diameter of 8.6 microns. The capsules were purified by centrifuging twice, redispersing the solids in water between cycles and afterward.

To 20.31 g of the centrifuged capsule slurry was added 5 drops of Triton ® X-100 surfactant and 1.05 g of Carboset ® XL-11 (methylmethacrylate/ethyl acrylate/acrylic acid copolymer). The resulting slurry was coated with a 1 mil doctor knife onto Riston ® I-Film 102T. The film was air dried for two days. The film was then dry laminated onto a precleaned copper board as described in Example 1. After removing the film base, the film was exposed in a Riston ® PC-130 Printer at 150 mj/cm$^2$ through a 4 mil line and space phototool. The image was developed in a Riston ® Aqueous Developer System ADS-24 at a speed setting of 290 (half-pass time was about 24 seconds). The exposed copper was removed using a DEA 2401 containing cupric chloride etchant followed by resist stripping in a 1N NaOH bath to remove the resist. Some capsule residue was finally removed by washing with methylene chloride. High resolution circuit lines were thus obtained with the film treated with capsules showing good adhesion characteristics throughout the processing.

EXAMPLE 3

Microcapsules were prepared by the following procedure. An emulsifier solution was prepared by dissolving 48.5 g poly(ethylene-co-maleic anhydride) into 1200 ml of water by the addition of NaOH pellets and gently heating. A monomer phase was prepared by stirring 4.56 g terephthaloyl chloride, 2502 g Photomer ® 4149, and with 75.5 g trimethylolpropane triacrylate. An aqueous phase was prepared by dissolving 4.14 g sodium bicarbonate, 15.96 g sodium carbonate, and 7.99 g octane diamine (the amine is not added to the solution until just prior to use) in 300 ml water.

Then 400 ml of the emulsifier solution was put into a Waring blender and the monomer phase was emulsified into it. Immediately after emulsification, the aqueous phase of amine was added to the blender. The reaction mixture was stirred at room temperature for two hours. At the end of the reaction period. size analysis showed particles with a volume mean size of 14.1 microns. The capsules were purified by centrifuging twice, washing the solids with water between cycles, and redispersing the solids in water afterward.

To 20.29 g of the capsule slurry was added 5 drops Triton ® X-200 and 1.15 g Carboset ® XL-11. The resulting capsules slurry was coated onto Riston ® I-Film 102T with a 1 mil doctor knife. The film was air dried. This capsule treated film was processed in the same manner as described in Example 2. The resulting board had high resolution circuit lines.

EXAMPLE 4

Two microcapsule samples were prepared by the following procedures. An emulsifier solution was prepared by dissolving 16.01 poly(ethylene-co-maleic anhydride) into 401.5 g of water by the addition of NaOH pellets and gently heating. A monomer phase was prepared by stirring 4.76 g adipoyl chloride with 102.8 g trimethylolpropane triacrylate. An aqueous phase was prepared by dissolving 4.08 g sodium bicarbonate, 16.1 g sodium carbonate, and 8.34 g diethylene triamine (the amine is not added to the solution until just prior to use) in 300 g water.

The emulsifier solution is put into a Waring blender and the monomer phase was emulsified into it at a variable transformer setting of 30 for 45 seconds. Immediately after emulsification, the aqueous phase of amine was added to the blender. The reaction mixture was stirred at room temperature for two hours. At the end of the reaction period, size analysis showed particles with a volume mean size of 6.5 microns. The capsules were purified by centrifuging twice, washing the solids with water between cycles, and redispersing the solids in water afterward.

The second batch was prepared as follows. An emulsifier solution was prepared by dissolving 16.00 g poly(ethylene-co-maleic anhydride) into 398.6 g trimethylolpropane triacrylate. An aqueous phase was prepared by dissolving 4.05 g sodium bicarbonate, 16.33 g sodium carbonate, and 8.22 g hexane diamine (the amine is not added to the solution until just prior to use) in 300 g water.

The emulsifier solution is put into a Waring blender and the monomer phase was emulsified into it at a variable transformer setting of 30 or 45 seconds. Immediately after emulsification, the aqueous phase of amine was added to the blender. The reaction mixture was stirred at room temperature for two hours. At the end of the reaction period, size analysis showed particles with a volume mean size of 3.0 microns. The capsules were purified by centrifuging twice, washing the solids with water between cycles, and redispersing the solids in water afterward.

The first and second capsule slurries were coated separately onto Riston® I-Film 102T with a 1 mil doctor knife. The two films were air dried. The film coated with the first capsule slurry yielded an overcoat that was slightly tacky; however, the second capsule slurry yielded a film overcoat that was not tacky.

What is claimed is:

1. A storage stable photopolymerizable element wound in a roll comprising a supported photopolymerizable composition which contains all components needed for photopolymerization of said composition wherein the composition contains microcapsules on its surface or concentrated near its surface within the composition on a side of the photopolymerizable composition which faces away from the support or which faces toward the support whereby the microcapsules contain a material which is a liquid or a precursor to a liquid whereby said liquid or precursor has the ability to influence the interfacial properties of the photopolymerizable composition or a photopolymerized composition resulting from said photopolymerizable composition and another material and wherein the support comprises a strippable flexible film.

2. The element of claim 1 wherein the microcapsules are on the side of the composition which faces away from the support.

3. The element of claim 1 wherein the microcapsules are on the side of the composition which faces toward the support.

4. The element of claim 1 which does not contain a cover sheet.

5. The element of claim 1 wherein the microcapsules contain a plasticizer.

6. A storage stable photopolymerizable element wound in a roll comprising a supported photopolymerizable composition which contains all components needed for photopolymerization of said composition whereby the support comprises a strippable flexible film wherein the composition contains microcapsules on its surface or concentrated near its surface within the composition on a side of the photopolymerizable composition which faces away from the support or which faces toward the support and wherein the microcapsules contain a dye.

7. A storage stable element wound in a roll comprising a supported photosensitive positive working composition whereby the support comprises a strippable flexible film wherein the composition contains microcapsules on its surface or concentrated near its surface within the composition on a side of the composition which faces away from the support or which faces toward the support whereby the microcapsules contain a material which is a liquid or a precursor to a liquid whereby said liquid or precursor has the ability to influence the interfacial properties of the composition or composition resulting therefrom and another material.

8. A method comprising applying to a substrate a supported photopolymerizable element containing a photopolymerizable element containing a photopolymerizable layer, imagewise exposing the layer to actinic radiation and removing unexposed areas of the photopolymerizable areas of the photopolymerizable composition whereby the support comprises a strippable flexible film wherein the composition contains microcapsules on its surface or concentrated near its surface within the composition on a side of the photopolymerizable composition which faces away from the support or which faces toward the support whereby the microcapsules contain a material which is a liquid or a precursor to a liquid whereby said liquid or precursor has the ability to influence the interfacial properties of the photopolymerizable composition or a photopolymerized composition resulting from said photopolymerizable composition and another material.

9. The method of claim 8 wherein the microcapsules are on the side of the composition which faces away from the support.

10. The method of claim 9 wherein the photopolymerizable composition would otherwise adhere to the substrate without insufficient adhesion for further processing without the presence of the microcapsules.

11. The method of claim 9 wherein the microcapsules are on the side of the composition which faces toward the support.

12. The element of claim 1 which contains microcapsules on a side of the composition which faces away from the support and on a side of the composition which faces toward the support.

13. The element of claim 7 which contains microcapsules on a side of the composition which faces away from the support and on a side of the composition which faces toward the support.

14. The method of claim 8 wherein microcapsules are on a side of the composition which faces away from the support and on a side of the composition which faces toward the support.

* * * * *